United States Patent
Kim et al.

(10) Patent No.: US 7,741,888 B2
(45) Date of Patent: Jun. 22, 2010

(54) PLL CIRCUIT HAVING LOOP FILTER AND METHOD OF DRIVING THE SAME

(75) Inventors: Yong-Ju Kim, Gyenoggi-Do (KR);
Kun-Woo Park, Gyeonggi-do (KR);
Jong-Woon Kim, Gyeonggi-do (KR);
Hee-Woong Song, Gyeonggi-do (KR);
Ic-Su Oh, Gyeonggi-do (KR);
Hyung-Soo Kim, Gyeonggi-do (KR);
Tae-Jin Hwang, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 0 days.

(21) Appl. No.: 11/822,103

(22) Filed: Jul. 2, 2007

(65) Prior Publication Data

US 2008/0068058 A1   Mar. 20, 2008

(30) Foreign Application Priority Data

Sep. 14, 2006   (KR) ...................... 10-2006-0088815

(51) Int. Cl.
*H03L 7/06* (2006.01)
(52) U.S. Cl. ...................... 327/156; 327/162
(58) Field of Classification Search ............... 327/156; 331/15–17
See application file for complete search history.

(56) References Cited

U.S. PATENT DOCUMENTS

| 6,029,250 | A | 2/2000 | Keeth | |
|---|---|---|---|---|
| 6,430,696 | B1 | 8/2002 | Keeth | |
| 6,912,680 | B1 | 6/2005 | Keeth | |
| 7,154,786 | B2 | 12/2006 | Ikai et al. | |
| 2005/0035797 | A1* | 2/2005 | Frans et al. | 327/156 |
| 2005/0127962 | A1* | 6/2005 | Furuya | 327/156 |
| 2005/0174180 | A1* | 8/2005 | Mone | 331/16 |
| 2006/0066759 | A1 | 3/2006 | Ikuma et al. | |
| 2006/0119405 | A1 | 6/2006 | Kobayashi | |

FOREIGN PATENT DOCUMENTS

| JP | 4107011 | 4/1992 |
|---|---|---|
| JP | 2004047066 | 2/2004 |
| JP | 2004070800 | 3/2004 |
| KR | 19940005331 | 3/1994 |
| KR | 1020000019406 | 4/2000 |
| KR | 1020050103367 | 10/2005 |
| KR | 1020060030056 | 4/2006 |

\* cited by examiner

*Primary Examiner*—Lincoln Donovan
*Assistant Examiner*—Daniel Rojas
(74) *Attorney, Agent, or Firm*—Venable LLP; Jeffri A. Kaminski

(57) ABSTRACT

A PLL circuit includes a phase detector that compares the phase of an input clock and the phase of a feedback clock and generates a pull-up control signal and a pull-down control signal. A loop filter pumps a voltage in response to the pull-up and pull-down control signals, filters the pumped voltage, and outputs a control voltage. A voltage controlled oscillator receives the control signal and oscillates an output clock. A clock divider divides the frequency of the output clock at a predetermined rate to generate the feedback clock. In the PLL circuit, the loop filter includes a compensator that compensates for a variation.

6 Claims, 4 Drawing Sheets

PLL CIRCUIT HAVING LOOP FILTER AND METHOD OF DRIVING THE SAME

CROSS-REFERENCE TO RELATED PATENT APPLICATION

This application claims the benefit of Korean Patent Application No. 10-2006-0088815, filed on Sep. 14, 2006, in the Korean Intellectual Property Office, the disclosure of which is incorporated herein in its entirety by reference.

BACKGROUND OF THE INVENTION

1. Technical Field

The present invention relates to a phase locked loop (PLL) circuit having a loop filter and a method of driving the same, and more particularly, to a PLL circuit having a loop filter that generates a control voltage having a constant level and to a method of controlling the same.

2. Related Art

As the processing speed of semiconductor memory apparatuses becomes faster, the frequency of an external clock increases, and accordingly, the frequency of an internal clock also increases. When the frequency of the internal clock is increased, an operation of inputting/outputting data in synchronization with a clock becomes unstable in a semiconductor memory apparatus having a delay lock loop (DLL) circuit according to the related art. In particular, in semiconductor memory apparatuses requiring a high-speed operation, such as graphic memories, when a timing margin between data and a data strobing signal generated by the clock is reduced, the reliability of a data input operation is lowered.

Therefore, a method of providing a PLL circuit in the semiconductor memory apparatus has been introduced to improve the reliability of the data input operation. The semiconductor memory apparatus uses the PLL circuit to compare the timing of a clock with the timing of input data to determine a phase difference and control the phase of data with respect to the clock to synchronize the clock with the data, thereby improving the reliability of the data input operation.

In general, the PLL circuit includes a loop filter. There are two types of loop filters, that is, loop filters using clocks and loop filters without using a clock. The loop filters using clocks are classified into a two-stage RC filter, a self-biased loop filter, and a sample and reset filter.

The two-stage RC filter is typically used, but is sensitive to PVT (process, voltage, and temperature) characteristics, which results in a large variation in an output signal. The self-biased loop filter is insensitive to the PVT characteristics, but outputs signals with a pattern jitter. The sample and reset loop filter is not sensitive to the PVT characteristics, and is capable of removing the pattern jitter from an output signal by using an additional switch capacitor circuit.

The sample and reset loop filter requires two voltage pumps for driving a resistor and a capacitor, and the two voltage pumps require the same amount of current.

However, a difference in charge injection amount and charge distribution amount may occur between the two voltage pumps, which may cause mismatched charges between the two voltage pumps. The mismatch between the two voltage pumps may cause a variation in the level of an output voltage of the loop filter and errors in the phase fixing operation of the PLL circuit.

SUMMARY OF THE INVENTION

An embodiment of the present invention provides a PLL circuit capable of stabilizing the level of an output voltage.

Another embodiment of the invention provides a method of driving a PLL circuit that is less sensitive to PVT characteristics and can prevent a pattern jitter and an erroneous operation.

According to an embodiment of the present invention, a phase locked loop (PLL) circuit includes a loop filter. The loop filter includes: a pumping unit that pumps a voltage; a filtering unit that filters the voltage pumped by the pumping unit; and a compensator that is connected to the filtering unit and compensates for a variation in the pumped voltage.

According to another embodiment of the invention, a PLL circuit includes: a phase detector that compares the phase of an input clock and the phase of a feedback clock and generates a pull-up control signal and a pull-down control signal; a loop filter that pumps a voltage in response to the pull-up and pull-down control signals, filters the pumped voltage, and outputs a control voltage; a voltage controlled oscillator that receives the control signal and oscillates an output clock; and a clock divider that divides the frequency of the output clock at a predetermined rate to generate the feedback clock. In the PLL circuit, the loop filter includes a compensator that compensates for a variation in the pumped voltage.

According to still another embodiment of the invention, there is provided a method of driving a PLL circuit including a pull-up pumping unit that generates a first pumping voltage from an external power supply voltage and supplies the first pumping voltage to a first node when a pull-up control signal is enabled, a pull-down pumping unit that generates a second pumping voltage from the voltage applied to the first node and supplies the second pumping voltage to a ground terminal when a pull-down control signal is enabled, and a filtering unit having a resistor and a capacitor connected between the first node and the ground terminal. The method includes: comparing the potentials of both ends of the resistor; compensating for the potential of one end of the resistor connected to the capacitor according to the result of the comparison; and filtering a signal of the first node, which is the other end of the resistor.

DESCRIPTION OF EXEMPLARY EMBODIMENT

The present invention will now be described more fully with reference to the accompanying drawings, in which exemplary embodiments of the invention are shown. The invention may, however, be embodied in many different forms and should not be construed as being limited to the embodiments set forth herein; rather, these embodiments are provided so that this disclosure will be thorough and complete, and will fully convey the concept of the invention to those skilled in the art.

Figure 1:
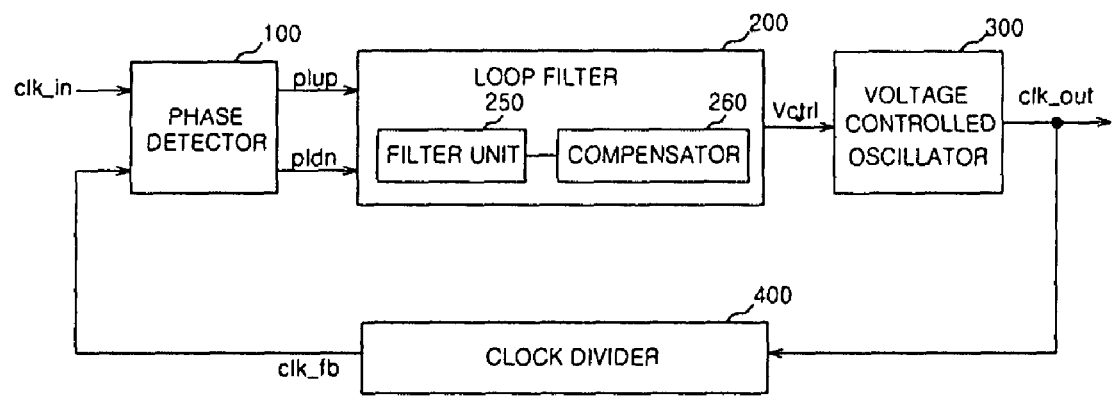
FIG. 1 is a block diagram schematically illustrating a PLL circuit according to an embodiment of the invention.

Referring to FIG. 1, a PLL circuit 10 includes a phase detector 100, a loop filter 200, a voltage controlled oscillator 300, and a clock divider 400.

The phase detector 100 compares the phase of an input clock clk_in with the phase of a feedback clock clk_fb to generate a pull-up control signal plup and a pull-down control signal pldn. The phase detector 100 enables both the pull-up control signal plup and the pull-down control signal pldn when the phase of the input clock clk_in is equal to that of the feedback clock clk_fb.

The loop filter 200 pumps a voltage in response to input of the pull-up control signal plup and the pull-down control signal pldn and removes noise components from the pumped voltage, to output a control voltage Vctrl. The loop filter 200 includes a filter unit 250 and a compensator 260.

Figure 2:
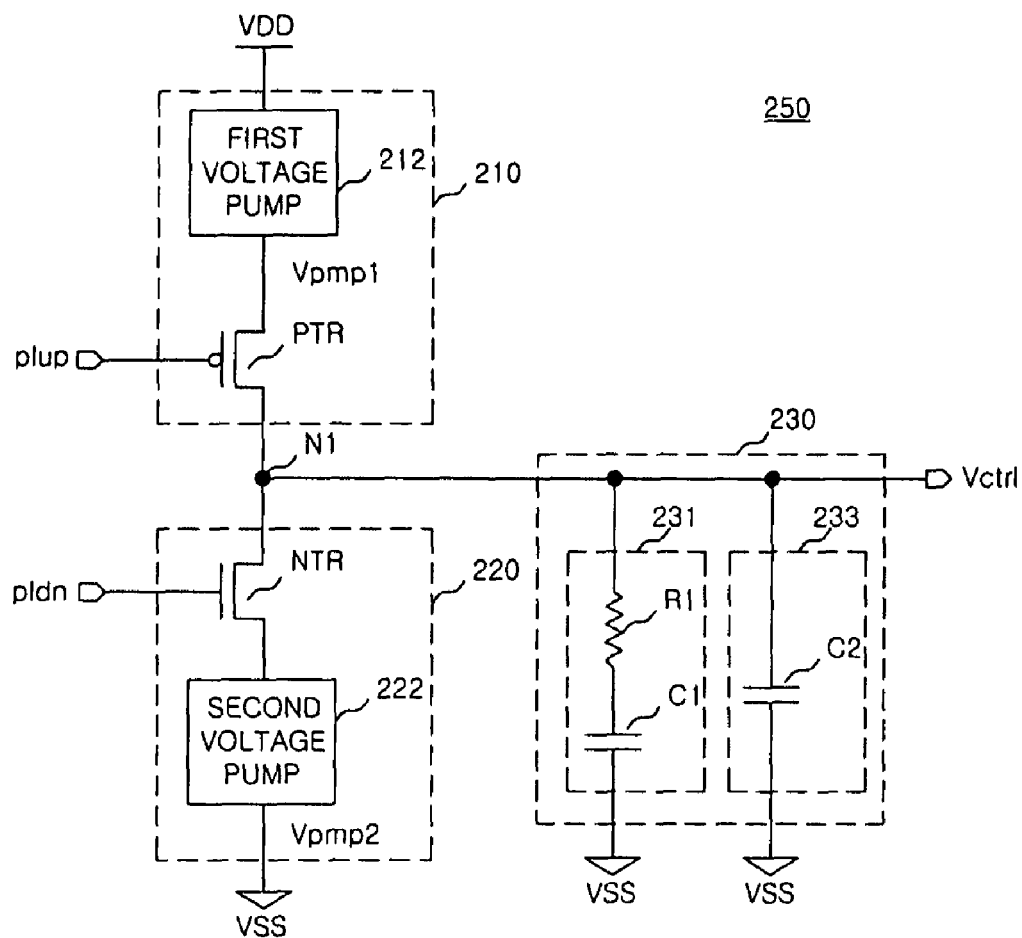
FIG. 2 is a circuit diagram illustrating a filter unit of a loop filter according to an embodiment of the invention.

As shown in FIG. 2, the filter unit 250 includes a pull-up pumping unit 210, a pull-down pumping unit 220, and a filtering unit 230.

The pull-up pumping unit 210 includes a first voltage pump 212 and a PMOS transistor PTR. The first voltage pump 212 generates a first pumping voltage Vpmp1 from an external power supply voltage VDD, and the PMOS transistor PTR supplies the first pumping voltage Vpmp1 to a first node N1 in response to the pull-up control signal plup.

The pull-down pumping unit 220 includes an NMOS transistor NTR and a second voltage pump 222. The NMOS transistor NTR transmits the voltage of the first node N1 to the second voltage pump 222 in response to the pull-down control signal pldn. The second voltage pump 222 pumps the voltage of the first node N1 transmitted from the NMOS transistor NTR to a second pumping voltage Vpmp2 and supplies the pumped voltage to a ground terminal vss.

The filtering unit 230 includes a first-stage filter 231 and a second-stage filter 233. The first-stage filter 231 may include a first resistor R1 and a first capacitor C1 connected in series to each other, and the second-stage filter 233 may include a second capacitor C2. The first-stage filter 231 and the second-stage filter 233 are connected in parallel between the first node N1 and the ground terminal VSS. The capacitor C2, which is the second-stage filter 231, secondarily filters the voltage passed through the first-stage filter 231 to reduce a pattern jitter.

Figure 3:
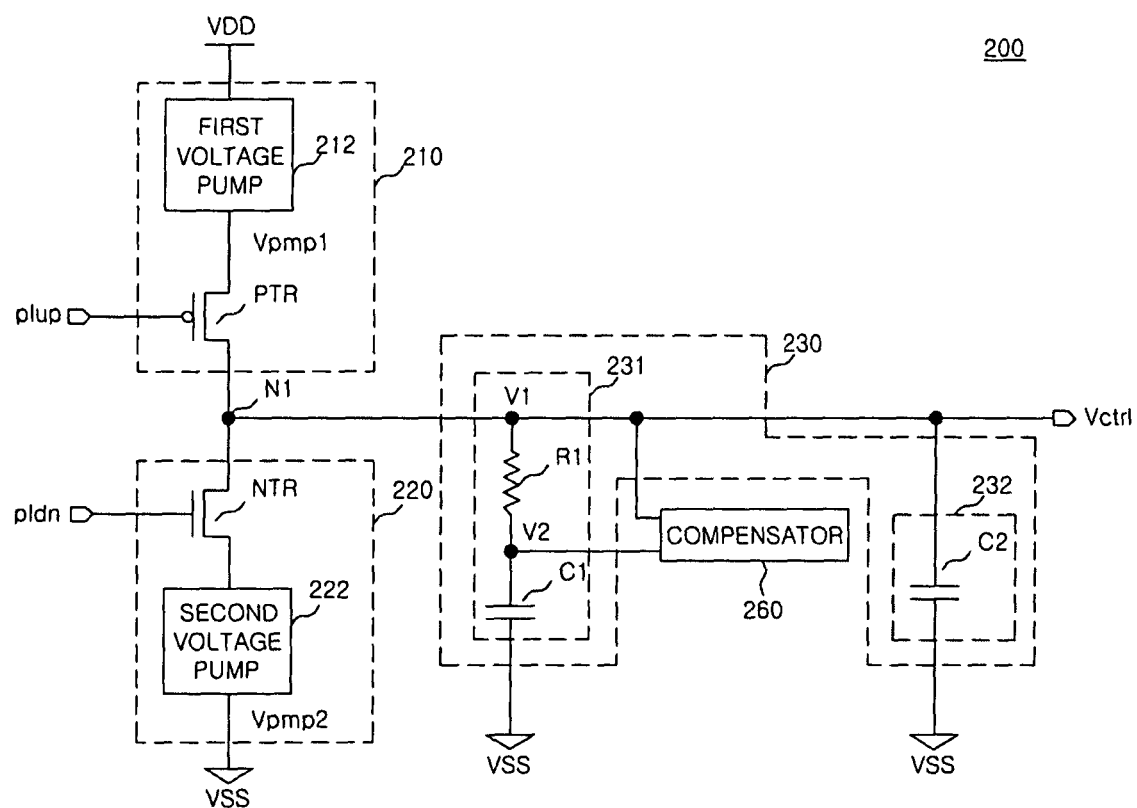
FIG. 3 is a circuit diagram illustrating a loop filter having a compensator according to an embodiment of the invention.

As shown in FIG. 3, the compensator 260 is connected between both ends of the resistor R1. The compensator 260 compares the potentials of both ends of the first resistor R1 to compensate the potential (V1) of the first end of the first resistor R1 for the potential (V2) of the second end of the first resistor R1. Preferably, the compensator 260 makes the potentials V1 and V2 equal to each other. When the potentials V1 and V2 are equal to each other, the potential V1 is maintained at a constant level even when the amount of current flowing to the first node N1 varies due to the difference between operational performances (charge injection amounts and charge distribution amounts) of the first and second voltage pumps 212 and 222, the difference between resistance values of the PMOS transistor PTR and the NMOS transistor NTR, and PVT characteristics. This is because the potential V2 compensates for an AC component of the potential V1 so that a DC component does not vary, and the AC components of the potentials V1 and V2 are filtered by the first capacitor C1.

Figure 4:
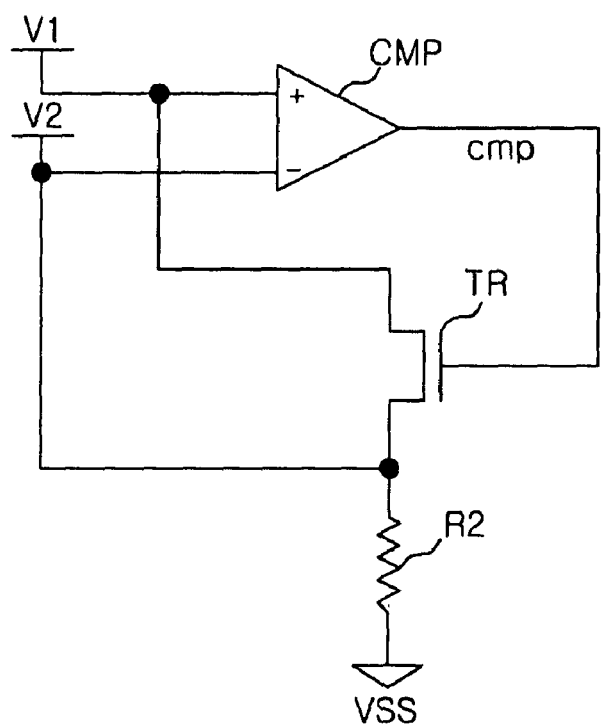
FIG. 4 is an internal circuit diagram illustrating the compensator according to an embodiment of the invention.

As shown in FIG. 4, the compensator 260 according to this embodiment may include a comparator CMP, a transistor TR, and a second resistor R2. The comparator CMP compares the potential V1 with the potential V2 to output a comparison signal cmp. The transistor TR includes a gate to which the comparison signal cmp is input, a drain to which the voltage V1 is applied, and a source to which the voltage V2 is applied. The second resistor R2 is provided between the source of the transistor TR and the ground terminal.

When the potential V1 is higher than the potential V2, the comparison signal cmp has a high level, and the transistor TR is turned on, so that the potential V1 is supplied to the source of the transistor TR having the potential V2 applied thereto. This operation is continuously performed until the potential V2 is higher than the potential V1, and thus the potential V1 becomes equal to the potential V2.

In this way, the loop filter 200 can obtain a stable control voltage Vctrl without, for example, a pattern jitter by using the compensator 260 even when the potential of signals transmitted from the first and second pumping units 210 and 220 vary due to PVT characteristics and the difference between the operational performances of the voltage pumps.

Figure 5:
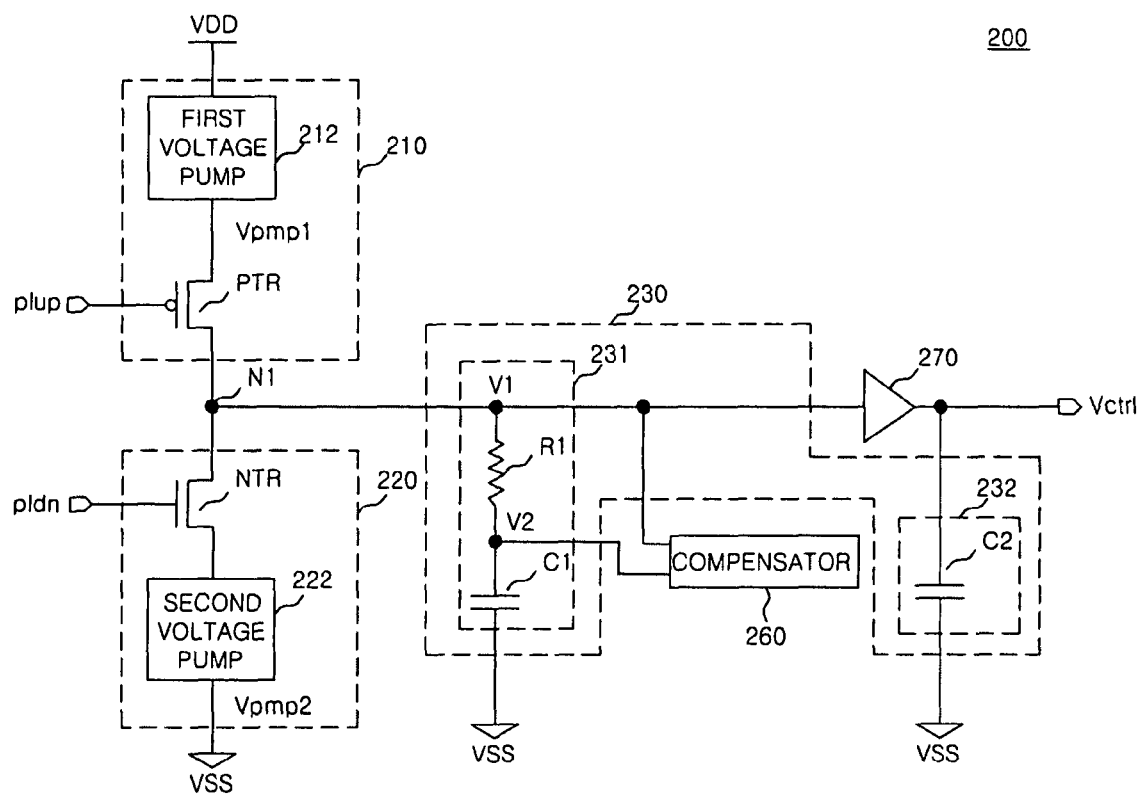
FIG. 5 is a circuit diagram illustrating a loop filter having a compensator according to another embodiment of the invention.

Referring to FIG. 5, an additional buffer 270 may be connected between the first-stage filter 231 and the second-stage filter 233. The buffer 270 buffers the potential V1 compensated by the compensator 260 and supplies signals having a stable level to the second-stage filter 233. The second-stage filter 233 filters the buffered signals and outputs a stable control voltage Vctrl.

Referring to FIG. 1 again, the voltage controlled oscillator 300 receives the control voltage Vctrl and oscillates an output clock clk_out.

The clock divider 400 divides the frequency of the output clock clk_out at a predetermined rate to generate the feedback clock clk_fb.

According to the above-mentioned embodiment of the invention, it is possible to obtain a stable control voltage Vctrl by making the potentials at both ends of the first resistor R1 provided in the filtering unit 230 of the loop filter 200 equal to each other, even when the potential of signals transmitted from the first and second pumping units 210 and 220 vary.

In addition, according to the above-mentioned embodiment of the invention, the buffer 270 is additionally provided in the loop filter 200, which makes it possible to further stabilize the control voltage Vctrl. Furthermore, it is possible to stabilize the control voltage Vctrl that is variable due to various factors and improve the reliability of a clock phase fixing operation of a PLL circuit.

It will be apparent to those skilled in the art that various modifications and changes may be made without departing from the scope and spirit of the present invention. Therefore, it should be understood that the above embodiments are not limitative, but illustrative in all aspects. The scope of the present invention is defined by the appended claims rather than by the description preceding them, and therefore all changes and modifications that fall within metes and bounds of the claims, or equivalents of such metes and bounds are therefore intended to be embraced by the claims.

What is claimed is:

1. A phase locked loop (PLL) circuit comprising:
 a loop filter,
 wherein the loop filter includes:
  a pull-up pumping unit configured to generate a first pumping voltage from an external power supply voltage when a pull-up control signal is enabled;
  a pull-down pumping unit configured to connect to the pull-up pumping unit at an output terminal, and generate a second pumping voltage from the first pumping voltage and supply the second pumping voltage to a ground terminal, when a pull-down control signal is enabled;
  a filtering unit configured to filter the first and the second pumping voltages from the pull-up and the pull-down pumping units, and to include a first resistor having a first end and a second end; and a compensator configured to connect the filtering unit and output a control voltage to compare a voltage of two signals, wherein one of the two signals is based upon a difference between the first pumping voltage and the second pumping voltage, and to compensate for the difference between the first pumping voltage and the second pumping voltage according to a comparison signal, wherein the compensator comprises:

a comparator that compares potentials of both ends of the first resistor to output the comparison signal, and an equalizer that makes potentials of both ends of the first resistor in the filtering unit equal to each other in response to the comparison signal.

2. The PLL circuit of claim 1, wherein the filtering unit includes:

a first-stage filter having the first resistor having the first end and a second end and the first capacitor connected between the output terminal of the pumping units and a ground terminal; and a second-stage filter connected in parallel to the first-stage filter and composed of a second capacitor.

3. The PLL circuit of claim 2, wherein the equalizer is a transistor that has a gate to which the comparison signal of the comparator is input, a drain to which the potential of the first end of the first resistor is input, and a source to which the potential of the second end of the first resistor is input, and wherein the compensator further includes:

a second resistor connected between the ground terminal and the source of the transistor.

4. The PLL circuit of claim 2, wherein the loop filter further includes:

a buffer between the first-stage filter and the second-stage filter to buffer the pumping voltages having passed through the first-stage filter.

5. A PLL circuit comprising:

a phase detector that compares a phase of an input clock and a phase of a feedback clock to generate a pull-up control signal and a pull-down control signal;

a loop filter that pumps a voltage in response to the pull-up and pull-down control signals to obtain a first and second pumping voltages and filters the first and second pumping voltages to output a control signal, wherein the loop filter further includes: a pumping unit having a pull-up pumping unit and a pull-down pumping unit to obtain the pumping voltages at an output terminal; and a filtering unit that filters the pumping voltages from the pumping unit, wherein the pull-up pumping unit is configured to generate a first pumping voltage from an external power supply voltage when the pull-up control signal is enabled, and the pull-down pumping unit is configured to connect to the pull-up pumping unit, generate a second pumping voltage from the first pumping voltage and supply the second pumping voltage to a ground terminal when the pull-down control signal is enabled, and wherein the compensator is connected to the filtering unit wherein the filtering unit includes: a first-stage filter having a first resistor with a first end and a second end and a first capacitor connected between the output terminal of the pumping unit and a ground terminal; and a second-stage filter connected in parallel to the first-stage filter and is composed of a second capacitor, and wherein the compensator makes potentials of both ends of the first resistor in the filtering unit equal to each other;

a voltage controlled oscillator that receives the control signal to oscillate an output clock; and a clock divider that divides a frequency of the output clock at a predetermined rate to generate the feedback clock, wherein the loop filter includes a compensator that compensates for a difference between the first pumping voltage and the second pumping voltage and outputs the control signal, wherein the compensator includes:

a comparator that compares the potentials of both ends of the first resistor and outputs a comparison signal;

a transistor that has a gate to which the comparison signal of the comparator is input, a drain to which the potential of the first end of the first resistor is input, and a source to which the potential of the second end of the first resistor is input; and a second resistor connected between the ground terminal and the source of the transistor.

6. The PLL circuit of claim 5, wherein the loop filter further includes:

a buffer between the first-stage filter and the second-stage filter to buffer the pumping voltages having passed through the first-stage filter.

* * * * *